United States Patent [19]
Davis et al.

[11] Patent Number: 6,062,302
[45] Date of Patent: *May 16, 2000

[54] COMPOSITE HEAT SINK

[75] Inventors: Dwight Maclaren Davis, Pickerington; Keith Alan Gossett, Canal Westchester, both of Ohio

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/940,754

[22] Filed: Sep. 30, 1997

[51] Int. Cl.$^7$ ........................................... F28D 15/00
[52] U.S. Cl. ................. 165/104.26; 165/104.21; 165/185; 361/700
[58] Field of Search .................... 361/700; 257/715; 165/104.26, 104.21, 104.33, 185; 174/15.2

[56] References Cited

U.S. PATENT DOCUMENTS

| | | | |
|---|---|---|---|
| 4,018,269 | 4/1977 | Honda et al. | 165/104.26 |
| 4,135,371 | 1/1979 | Kesselrihg et al. | 165/104.26 X |
| 4,966,226 | 10/1990 | Hamburgen | 361/700 X |
| 5,216,580 | 6/1993 | Davidson et al. | 165/104.33 |
| 5,386,143 | 1/1995 | Fitch | 165/104.33 X |
| 5,458,189 | 10/1995 | Larzson et al. | 165/104.33 |
| 5,465,782 | 11/1995 | Sun et al. | 361/700 X |
| 5,579,830 | 12/1996 | Giammaruti | 165/104.21 X |
| 5,582,242 | 12/1996 | Hamburgen et al. | 165/104.21 |
| 5,660,229 | 8/1997 | Lee et al. | 165/104.26 |
| 5,848,637 | 12/1998 | Lee | 165/104.21 |

FOREIGN PATENT DOCUMENTS

| | | | |
|---|---|---|---|
| 0251836A1 | 5/1987 | European Pat. Off. . | |
| 0000492 | 1/1982 | Japan | 165/104.26 |
| 0096992 | 6/1983 | Japan | 165/104.33 |
| 1264296 | 10/1989 | Japan | 361/700 |
| 4225791 | 8/1992 | Japan | 165/104.33 |

*Primary Examiner*—Christopher Atkinson

[57] ABSTRACT

The present invention is a heat sink with a heat transfer medium for enhancing the heat transferring ability of the heat sink. In one embodiment, the heat sink comprises a plurality of fins with cavities, a base and a fluid heat transfer medium. The fins are in thermal contact with the base and configured to form a series of longitudinal channels through which air or a fluid medium may pass. The fluid heat transfer medium contained within each of the cavities. The fluid heat transfer medium enhances the heat sink's ability to transfer heat without increasing its surface area, size and/or weight. This enhancement is due to the fluid heat transfer medium's latent heat of vaporization and condensation. Specifically, a larger amount energy is required to vaporize the fluid heat transfer medium. Thus, a large amount of heat can be conducted from the base to the fluid heat transfer medium. Conversely, as the vaporized fluid heat transfer medium condenses on the upper cooler walls of the fins, a large amount of energy is conducted from the vaporized fluid heat transfer medium to the fins. Thus, a larger amount of heat can be conducted from the fluid heat transfer medium to the fins which can then dissipate the heat to lower temperature surroundings.

11 Claims, 3 Drawing Sheets and heat from the heat source to the lower temperature surroundings. Some factors influencing this ability includes the heat transfer rate of the material from which the heat sink was constructed and the surface area of the heat sink. The heat transferring ability of a heat sink may be increased using a material with a higher heat transfer rate to construct the heat sink. Heat sinks typically comprises one solid piece of material that has a high conductivity with an adequate mechanical strength for secondary support functions. The materials that possess these qualities include metals or metallized plastics, such as aluminum and copper. The heat transfer rates for the aforementioned metals and metallized plastics are as follows: 0.19 deg Celsius/Watt-inch and 0.1 deg Celsius/Watt-inch, respectively. The heat transferring ability of a heat sink may also be increased by increasing the surface area through which heat may be dissipated, e.g., lengthen the fins. This, however, translates into increases the heat sink's size and weight. Such increases are undesirable especially when space is limited.

COMPOSITE HEAT SINK

FIELD OF THE INVENTION

The present invention relates to transferring heat away from heat sources and, more specifically, to heat sinks.

BACKGROUND OF THE RELATED ART

Heat sinks are used in electronic equipment designs to transfer heat from a heat source, such as an electronic component, to lower temperature surroundings. The objective of a heat sink is to lower the temperature of the heat generator to prevent performance degradation and prolong the life of the heat source. A typical heat sink comprises a bottom plate and a plurality of fins. The plurality of fins are vertically attached to the bottom plate and configured to form a series of longitudinal channels. To transfer heat from a heat source, the bottom plate of the heat sink is affixed to the heat source such that thermal contact is achieved with the heat source. Heat is conducted from the heat source to the bottom plate which is then conducted to the fins where it is dissipated by thermal transfer to the lower temperature surroundings, such as air passing through the longitudinal channels. The typical heat transfer rate of a heat sink ranges from 50 to 200 watts per square foot, and is dependent upon extended surface area available, operating ambient temperatures, and material/material thickness.

The effectiveness of a heat sink depends on its ability to transfer heat from the heat source to the lower temperature surroundings. Some factors influencing this ability includes the heat transfer rate of the material from which the heat sink was constructed and the surface area of the heat sink. The heat transferring ability of a heat sink may be increased using a material with a higher heat transfer rate to construct the heat sink. Heat sinks typically comprises one solid piece of material that has a high conductivity with an adequate mechanical strength for secondary support functions. The materials that possess these qualities include metals or metallized plastics, such as aluminum and copper. The heat transfer rates for the aforementioned metals and metallized plastics are as follows: 0.19 deg Celsius/Watt-inch and 0.1 deg Celsius/Watt-inch, respectively. The heat transferring ability of a heat sink may also be increased by increasing the surface area through which heat may be dissipated, e.g., lengthen the fins. This, however, translates into increases the heat sink's size and weight. Such increases are undesirable especially when space is limited.

SUMMARY OF THE INVENTION

The present invention is a heat sink with a heat transfer medium for enhancing the heat transferring ability of the heat sink without increasing its size and/or weight. In one embodiment, the heat sink comprises a plurality of fins with cavities, a base and a fluid heat transfer medium. Each of the fins is in thermal contact with the base and configured to form a series of longitudinal channels through which air or a fluid medium may pass. The fins and base are constructed from thermal conductive material with adequate mechanical strength for secondary support functions. The fluid heat transfer medium is contained within each of the cavities. The fluid heat transfer medium may be a fluid with a thermal resistant and a boiling point lower than the thermal resistant and softening point, respectively, of the material used to construct the fins and base. Such a fluid transfer medium enhances the heat sink's ability to transfer heat because of its latent heat of vaporization and condensation. Specifically, a large amount of energy is required to vaporize the fluid heat transfer medium. Thus, a large amount of heat can be conducted from the base to the fluid heat transfer medium. Conversely, as the vaporized fluid heat transfer medium condenses on the upper cooler walls of the fins, a large amount of energy is conducted from the vaporized fluid heat transfer medium to the fins. Thus, a large amount of heat can be conducted from the fluid heat transfer medium to the fins which can then dissipate the heat to lower temperature surroundings.

BRIEF DESCRIPTION OF THE DRAWINGS

The features, aspects, and advantages of the present invention will become better understood with regard to the following description, appended claims, and accompanying drawings where:

DETAILED DESCRIPTION

Figure 1:
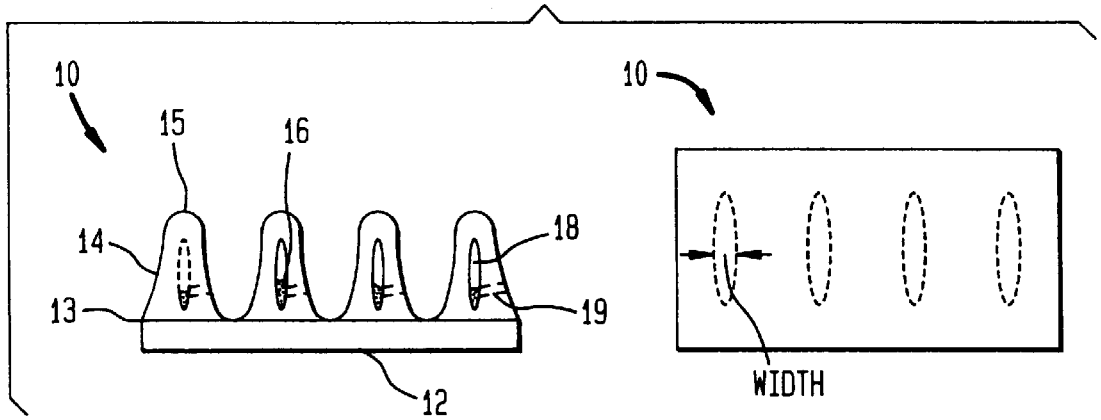
FIG. 1 depicts a heat sink in accordance with the present invention.

FIG. 1 depicts a heat sink 10 in accordance with the present invention. The heat sink 10 comprises a base 12, a plurality of fins 14 and a heat transfer medium 16. The base 12 may be any desired dimensions or shape depending upon the use for which it is intended, such as a rectangular flat plate. Generally, the dimensions and shape of the base 12 should allow for good thermal contact between the heat source and the heat sink. For example, if the heat source has a rectangular shape and a flat top surface, the base should have a rectangular shape and a flat bottom surface in order to achieve good thermal contact with the top of the heat source. The base 12 is constructed from a thermally conductive material, such as aluminum, aluminum alloys, copper, copper alloys and conductive or thin wall polymers.

The fins 14 are in thermal contact with the base 12 and positioned vertically at its base 13 to the top surface of the base 12 to increase the surface area of the heat sink 10. The fins 14 are configured to form longitudinal channels through which air or a fluid medium may pass and dissipate heat. The fins 14 may be any desired dimensions and shape. Generally, the fins 14 have a tabular, cylindrical or rectangular shape wherein the width of the fins 14 is gradually reduced from the base 13 to the tip 15 of the fins 14. The fins 14 are constructed from a thermally conductive material, such as aluminum, aluminum alloys, copper and copper alloys.

Each of the fins 14 has a fin cavity 18 in which the heat transfer medium 16 is contained. The fin cavities 18 may be entirely enclosed within the walls of the fins 14, as shown in FIG. 1, or enclosed using the base 12. The heat transfer medium may be a fluid heat transfer medium or a conductive heat transfer medium depending on the requirements of the application. Fluid heat transfer mediums includes any fluids that has a thermal resistant and a boiling point lower than the thermal resistant and softening point, respectively, of the material used to construct the fins and base. Additionally, the fluid heat transfer medium should not cause the fins and/or base to corrode. The fluid heat transfer medium include fluids such as tap water, distilled water, alcohol or a combination of the aforementioned. The fluid heat transfer medium 16 should only partially fill the fin cavities 18 to allow for vaporization and condensation.

The fluid heat transfer medium enhances the heat sink's ability to transfer heat without increasing its surface area, size or weight. This enhancement is due to the fluid heat transfer medium's latent heat of vaporization and condensation. Specifically, high levels of energy are required to vaporize the fluid heat transfer medium. Thus, a large amount of heat can be conducted from the base (or base of the fins) to the fluid heat transfer medium. Conversely, as the vaporized fluid heat transfer medium condenses on the upper cooler walls of the fins, high levels of energy are conducted from the vaporized fluid heat transfer medium to the fins. Thus, a larger amount of heat can be conducted from the fluid heat transfer medium to the fins.

The fin cavities 18 are air evacuated and sealed to prevent air or fluids from entering or leaving the fin cavities 18. Each of the fins 14 may include an orifice through which air is evacuated from the fin cavities 18 and the fluid heat transfer medium is introduced into the fin cavities 18. The orifices are sealed using plugs 19. The seal plugs 19 may be constructed using thermally conductive material such as a metal braze, a tin solder, a high temperature solder, a polymeric resin, or a threaded metal plug/valve system.

The second type of heat transfer mediums are conductive heat transfer mediums, which include any thermal conductive material (solid or liquid) with thermal resistant lower than the material used to construct the fins and/or base. Such heat transfer mediums should also be lightweight (compared to the fins and/or base) and low cost. Examples of conductive heat transfer mediums include conductive polymers, solid metals, tin, tin alloys, tin solders, metal filled polymers and conductive liquid polymers. The conductive heat transfer mediums should completely fill the cavity for achieving good thermal contact between the fins and the base.

The dimensions of the heat sink 10 should vary with each thermal application. The following example is provided for illustration purposes and should not be construed to limit the present invention in any manner. In this example, the base 12 is rectangular in shape with a thickness of 75 to 125 mm, a length of 304 mm and a width of 304 mm. The fins 14 are tabular with a height of 500 mm, a base diameter of 20 to 40 mm and a tip diameter of 10 to 20 mm. The thickness of the fin walls is approximately 10 mm. If conductive heat transfer medium is distilled water, the heat transfer rate of the heat sink would be approximately 800 to 1,000 watts per square foot. This is significantly greater than the heat transfer rate of typical prior art heat sinks.

Figure 2:
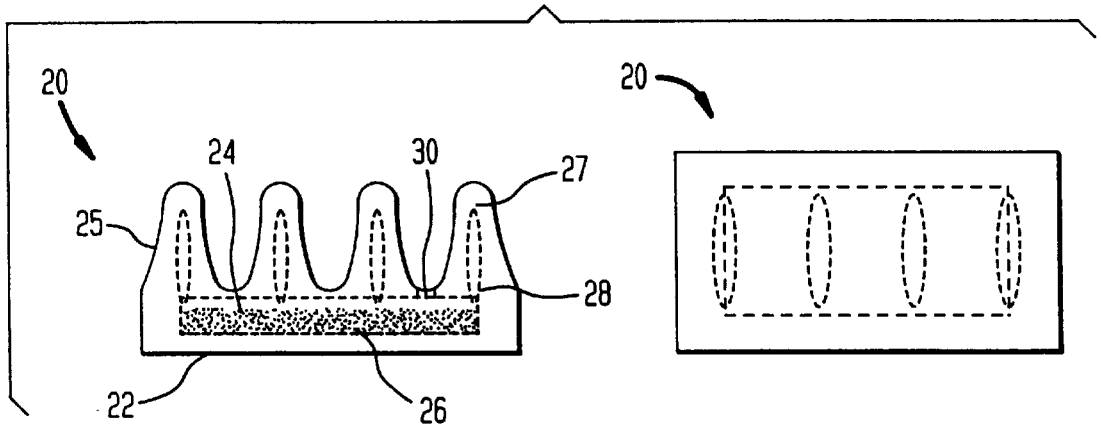
FIG. 2 depicts a heat sink with a base having a reservoir in which a fluid heat transfer medium is contained.

FIG. 2 shows a heat sink 20 with a base 22 having a reservoir 24 in which a fluid heat transfer medium 26 is contained in accordance with one embodiment of the present invention. Each of the fins 25 has a fin cavity 27 which, in conjunction with the reservoir 24 and other fin cavities 27, forms a heat sink cavity 28. Alternately, the base 22 may have multiple reservoirs for forming multiple heat sink cavities with the fin cavities. The heat sink 20 includes a single orifice through which air is evacuated from the heat sink cavity 28 and the fluid heat transfer medium 26 is introduced into the heat sink cavity 28. The orifice is sealed using a plug 30. The fins 26 of FIG. 2 have a tabular shape.

Figure 3:
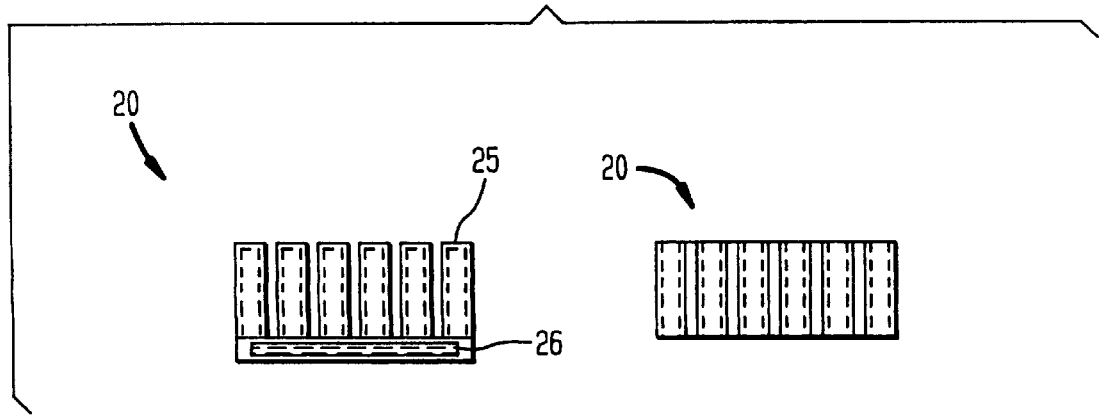
FIG. 3 depicts a heat sink with fins having a rectangular shape.

FIG. 3 illustrates the heat sink 20 with fins 25 having a rectangular shape.

Figure 4:
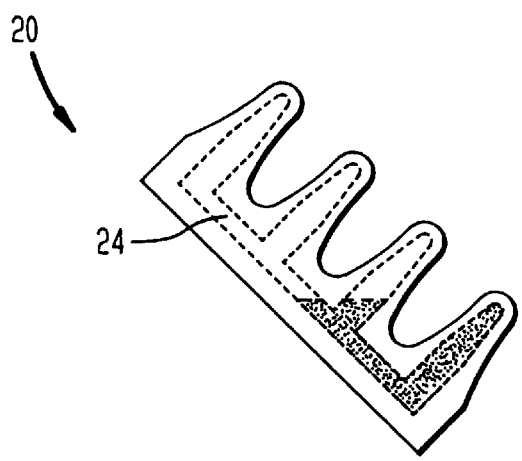
FIG. 4 depicts a non-level application of a heat sink with a base having a reservoir.

In level applications (or positions), the fluid heat transfer medium should be uniformly distributed throughout the reservoir 24. Non-level applications of the heat sink 20 of FIGS. 2 and 3 will cause non-uniform distribution of the fluid heat transfer medium in the reservoir 24. Specifically, the fluid heat transfer medium will collect towards the lower side of the reservoir 24. FIG. 4 illustrates a non-level application of the heat sink 20. Uniform distribution of the fluid heat transfer medium in the reservoir 24 allows for greater thermal contact between the fluid heat transfer medium and the base. Non-uniform distribution of the fluid heat transfer medium adversely affects the thermal contact with the base which, in turn, compromises the heat transferring ability of the heat sink.

Figure 5:
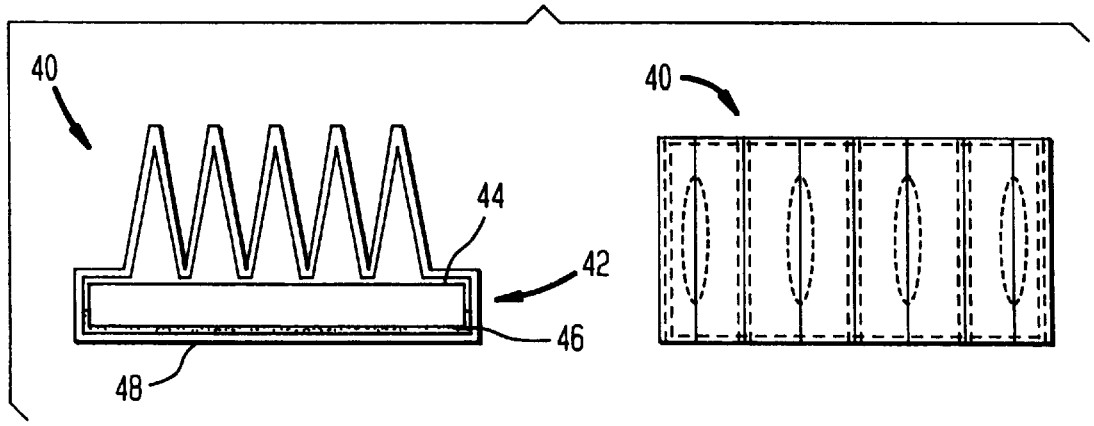
FIG. 5 depicts a heat sink with a base having a reservoir in which a fluid heat transfer medium and a wick are contained.

FIG. 5 illustrates a heat sink 40 with a base 42 having a reservoir 44 in which a fluid heat transfer medium 46 and a wick 48 are contained in accordance with one embodiment of the present invention. The wick 48 provides for a more uniform distribution of the fluid heat transfer medium throughout the reservoir 44, particularly in non-level applications of the heat sink 40. The wick 48 should be porous for capillary transport of the fluid heat transfer medium 46, and may be constructed from metals, such as copper and aluminum, plastics, glass, or ceramic.

Figure 6:
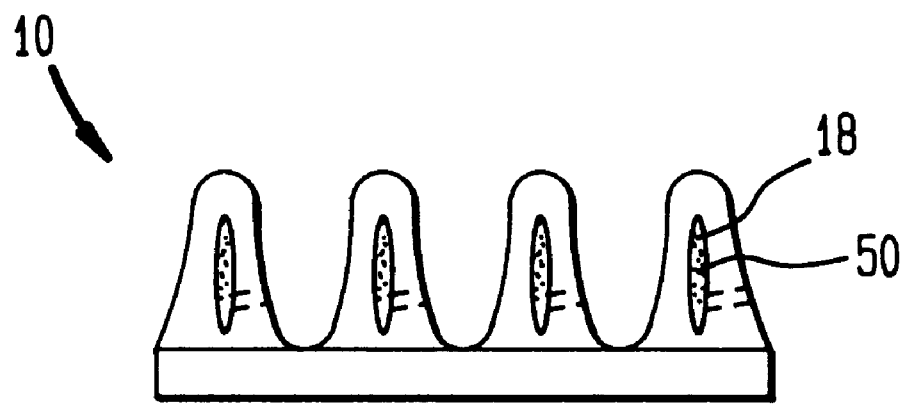
FIG. 6 depicts the heat sink of FIG. 1 in which a porous metal wick 50 is contained within the fin cavities.
Figure 7:
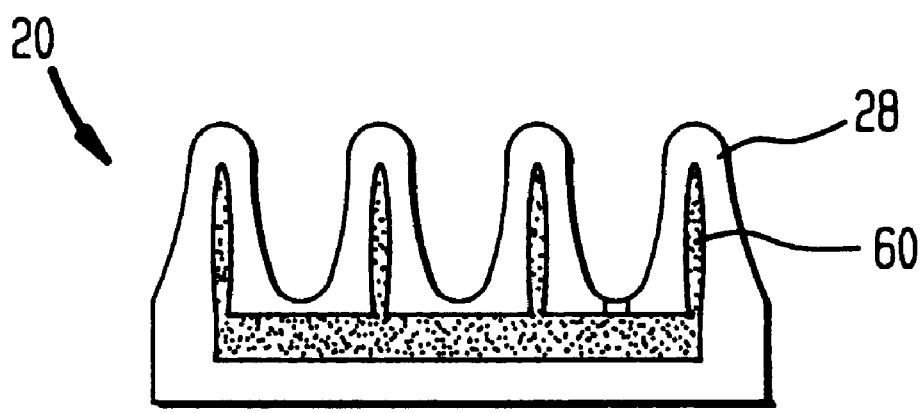
FIG. 7 depicts the heat sink of FIG. 2 in which a porous metal wick is contained within the heat sink cavity.

FIG. 6 illustrates the heat sink 10 of FIG. 1 in which a porous metal wick 50 is contained within the fin cavities 18, and FIG. 7 illustrates the heat sink 20 of FIG. 2 in which a porous metal wick 60 is contained within the heat sink cavity 28 in accordance with other embodiments of the present invention. In these embodiments, the porous metal wicks 50, 60 provide for a more uniform distribution of fluid heat transfer mediums through the fin cavities and/or reservoirs regardless of the orientation of the heat sinks 20, 30, thus enabling heat transfer operations in any orientation.

Although the present invention has been described in considerable detail with reference to certain embodiments, other versions are possible. Therefore, the spirit and scope of the present invention should not be limited to the description of the embodiments contained herein.

The invention claimed is:

1. A heat sink comprising:
    a plurality of fins having a plurality of cavities, each fin having one internal cavity and one orifice, each cavity of each fin being isolated from any cavity of any other fin;
    a base coupled to the plurality of fins, wherein each cavity does not extend into the base;
    a heat transfer medium contained within said cavities and in thermal contact with said base; and
    a plurality of seal plugs for sealing the orifices.

2. The heat sink of claim 1, wherein said heat transfer medium is a conductive heat transfer medium.

3. The heat sink of claim 1, wherein said heat transfer medium is a fluid that possess a thermal resistant and a boiling point lower than thermal resistants and softening points of said base and said plurality of fins.

4. The heat sink of claim 3 further comprising:
    a porous wick contained within said cavities.

5. The heat sink of claim 1, wherein said heat transfer medium comprises water.

6. The heat sink of claim 1, wherein said heat transfer medium comprises alcohol.

7. The heat sink of claim 1, wherein said heat transfer medium comprises a thermal conductive material that possess a thermal resistant lower than a thermal resistant of said base and said plurality of fins.

8. The heat sink of claim 1, wherein said plurality of fins are configured to form longitudinal channels.

9. The heat sink of claim 1, wherein each of said plurality of fins are constructed from a thermal conductive material.

10. The heat sink of claim 1, wherein said base is constructed from a thermal conductive material.

11. A heat sink comprising:

a plurality of fins having a plurality of cavities, each fin having one internal cavity and one orifice, each cavity of each fin being isolated from any cavity of any other fin;

a base coupled to the plurality of fins, wherein each cavity does not extend into the base; and a solid heat transfer medium contained within said cavities and in thermal contact with said base, the solid heat transfer medium possessing a thermal resistant lower than thermal resistants of said base and said plurality of fins.

* * * * *